Feb. 1, 1966 F. M. YOUNG 3,233,185
ELECTRICAL SIGNAL AMPLIFIER
Filed April 27, 1960 2 Sheets-Sheet 1

INVENTOR.
FRINK M. YOUNG
BY Kenway, Jenney, Witter & Hildreth
ATTORNEYS

Feb. 1, 1966 F. M. YOUNG 3,233,185

ELECTRICAL SIGNAL AMPLIFIER

Filed April 27, 1960 2 Sheets-Sheet 2

INVENTOR.
FRINK M. YOUNG
BY Kenway, Jenney, Witter & Hildreth
ATTORNEYS 3,233,185

ELECTRICAL SIGNAL AMPLIFIER

Frink Mansfield Young, Boston, Mass., assignor to Adage, Inc., Cambridge, Mass., a corporation of Massachusetts Filed Apr. 27, 1960, Ser. No. 25,086
7 Claims. (Cl. 330—19)

My invention relates to an improved electrical signal amplifier. More particularly it relates to an improved amplifier for direct voltages. Amplifiers made according to my invention are characterized by an extremely high input impedance, and are capable of relatively wide swings in output voltage. While these characteristics are generally desirable in direct voltage amplifiers, as will be discussed in greater detail below, prior to my invention this combination of characteristics was not readily available in direct voltage amplifiers which utilized transistors, or other semi-conductor devices as the active elements.

When it is desired to measure a direct voltage which appears at some point in a high impedance circuit, the impedance of the measuring instrument, when connected in parallel with the circuit, may so alter the source circuit that an incorrect measurement is obtained. For this reason, D.C. amplifiers having extremely high input impedances and unity gain have been developed for insertion between the circuit in which the voltage to be measured appears and the measuring instrument. Such amplifiers have relatively low output impedances and measuring instruments such as recorders, voltmeters, and similar apparatus may be connected across their output terminals without disturbing the source circuit.

Vacuum tube D.C. amplifiers, which are characterized by high input impedances and low output impedances have proven satisfactory for many applications of the type described. Such an amplifier is shown, for example in Valley and Wallman, "Vacuum Tube Amplifiers," McGraw-Hill Book Co., Inc., 1948, at page 480, figure 11.63. Certain complex circuits have also been developed using multiple vacuum tubes in the amplifier input stages to further increase the amplifier input impedance. However, transistors do not possess the inherent high input impedance of vacuum tubes and amplifiers using them have not prior to my invention had input impedances sufficiently high to perform well in the application discussed above. The complex circuits used to increase vacuum tube amplifier input impedance were not directly applicable to transistor circuits.

Amplifiers for the use discussed must be capable of output voltage swings at least as great as the total expected variation in the voltage to be measured. Again vacuum tubes which are inherently capable of withstanding high voltages provided satisfactory amplifiers. However, economical transistors have not as yet been developed which are capable of withstanding high voltages. Hence prior to my invention, transistor amplifiers, except those of great complexity and extremely high cost, have generally been limited to relatively low swings in output voltage, e.g. approximately 20 volts.

While transistors have some characteristics which make them less desirable than vacuum tubes for this application, they have many desirable characteristics including ruggedness, reliability, economy, compactness and low power drain. For this reason it is very desirable to make amplifiers of the type described using transistors or other semi-conductor devices as the active elements. In the past, such amplifiers have been designed in conventional fashion and the lower input impedance and output voltage swings have been tolerated because of the desirability of using transistors.

Accordingly it is a general object of my invention to provide an electrical signal amplifier of novel design for direct voltages.

A more specific object of my invention is to provide an amplifier of the type described utilizing transistors as the active elements thereof.

A further object of my invention is to provide an amplifier of the type described having extremely high input impedance and therefore capable of use as a buffer amplifier for measurement applications. A further object of my invention is to provide an amplifier of the type described which is capable of voltage swings much wider than those heretofore available with transistor amplifiers.

Other and further objects of my invention will in part be obvious and will in part appear hereinafter.

The invention accordingly comprises the features of construction, combinations of elements, and arrangement of parts which will be exemplified in the constructions hereinafter set forth, and the scope of the invention will be indicated in the claims.

For a fuller understanding of the nature and objects of my invention, reference should be had to the following detailed description taken in connection with the accompanying drawings in which.

Figures 1, 2:
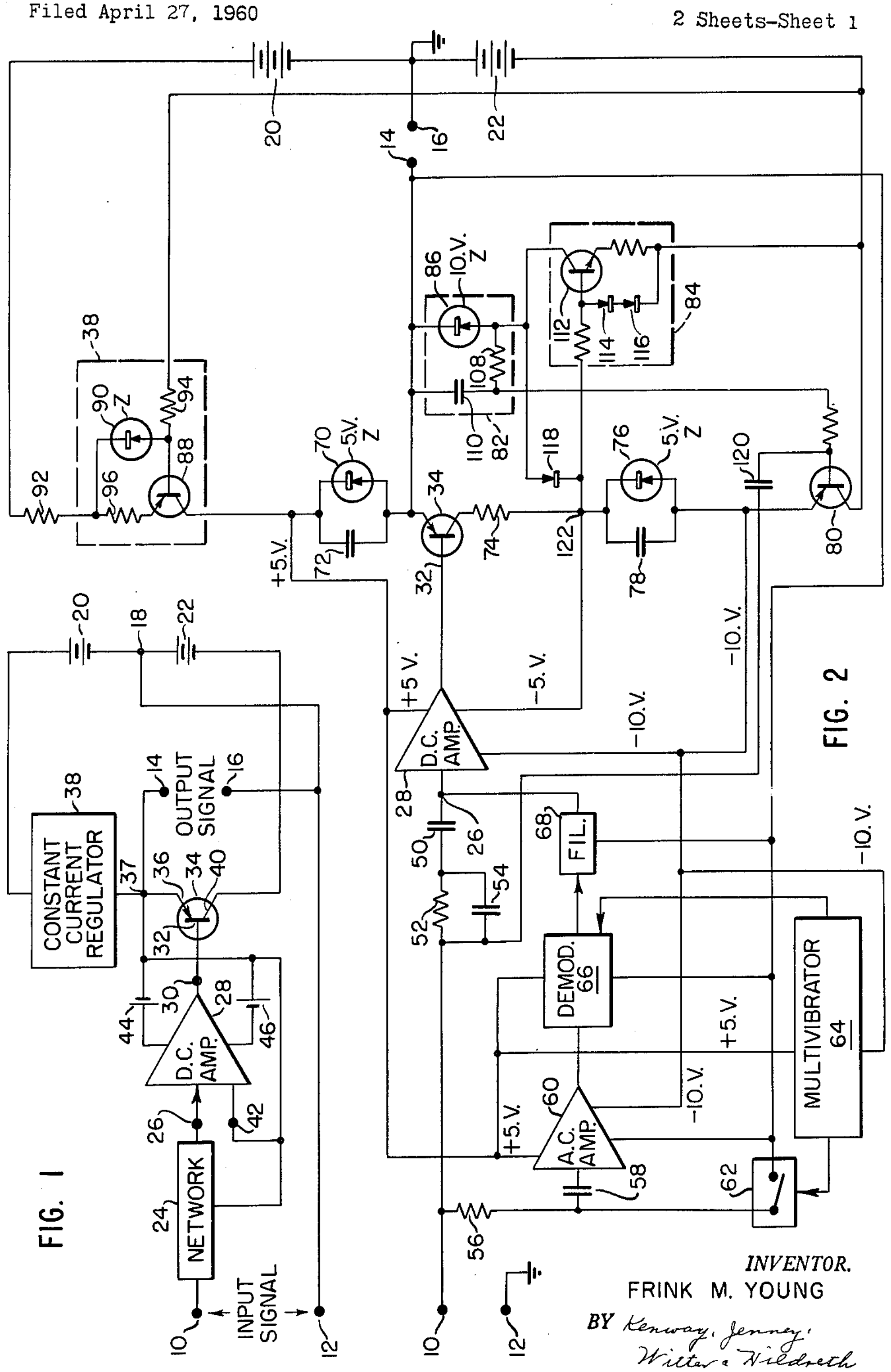
FIG.1 is a simplified block and line diagram of an amplifier made according to my invention.
FIG. 2 is a more detailed diagram, partially in block and partially in schematic form of a transistor amplifier made according to my invention.

As shown in FIG. 1, an amplifier made in accordance with my invention includes a pair of input terminals 10 and 12 and a pair of output terminals 14 and 16, terminals 12 and 16 being connected together and to the common terminal 18 of the batteries 20 and 22. A network 24 of appropriate type is connected between the amplifier input terminal 10 and the active input terminal 26 of the direct coupled amplifier 28 (herein referred to as a "D.C." amplifier). The active output terminal 30 of the D.C. amplifier is connected to the base 32 of the transistor 34. The emitter terminal 36 of the transistor 34 is connected via the terminal 37 to the constant current regulator 38 which in turn is connected to the positive terminal of the battery 20. The collector 40 of the transistor 34 is connected to the negative terminal of the battery 22 as shown.

As so far described the circuit is conventional. If the D.C. amplifier were supplied from voltage sources referenced to the same potential as the batteries 20 and 22, the input terminal 42 of the D.C. amplifier were connected to this reference, and a feedback path around the D.C. amplifier were provided, a conventional circuit would result. However, as shown in FIG. 1, the supply voltages for the D.C. amplifier 28 are provided by the direct voltage sources 44 and 46 respectively, each of which is referred to the potential of the output terminal 14 of the amplifier. Further the common, or reference terminal 42 of the D.C. amplifier 28 and the return path of the network 24 are also connected to the output terminal 14. Hence for the circuitry between input terminal 10 and the output terminal 30 of the amplifier 28, the reference or common potential is not the reference potential of the output stage power supplies 20 and 22 as in conventional amplifier designs, but rather is the active output terminal 14 of the amplifier.

By utilizing the terminal 14 as the reference potential for the internal circuitry several important advantages are obtained. It will be observed that the active elements of the D.C. amplifier 28 e.g. transistors are not required to handle the total output voltage swing. Only transistor 34 is required to do this. Since the transistors of amplifier 28 are referenced to the output voltage, their required voltage excursion is modest. This means that in the circuit shown, only output transistor 34 would be required to sustain a voltage swing comparable to the input voltage swing. While a single transistor might be used as an output device, I have found that by using the circuit shown in FIG. 3 which will be described below, several conventional transistors may be used to provide wide voltage swings.

Another important advantage of amplifiers using the construction described is the very low leakage current. This leakage current is the current drawn from the circuit in which the voltage to be measured appears by the amplifier. In conventional circuits this current is proportional to the difference between the measured potential and the reference potential e.g. ground. However in the circuit of FIG. 1, where both the network and amplifier 28 are referenced to the output potential, the only current which flows is proportional to the difference between measured and output potential. This current maintains, after amplification, the appropriate signal on the base of transistor 34. This current is extremely small and therefore the amplifier has an extremely high input impedance.

The operation of the amplifier shown in FIGURE 1 is as follows. A signal to be amplified is applied across terminals 10 and 12. The difference between the signal applied to terminal 10 and that appearing at output terminal 14 is applied to terminal 26 of amplifier 28 by network 24. The output potential of terminal 14 is connected both to terminal 42 of amplifier 28 and through network 24, to terminal 26. Thus, the difference in potential between input terminal 10 and output terminal 14, with respect to terminal 14 is amplified by amplifier 28 and applied to the base 32 of transistor 36. The signal applied to the base of this transistor adjusts the current flow through the transistor until the terminal 14 and the treminal 10 are at the same potential with respect to the common terminals 12 and 16. Of course, a resistance network may be provided as part of network 24 to divide the voltage fed back for comparison with the input voltage if other than unity gain is desired. Thus, for example if the voltage from terminal 14 is divided by 5 and then compared with the input signal, the amplifier would have an overall gain of 5.

In FIG. 2, I have illustrated a specific embodiment of an amplifier made according to my invention. As shown therein the D.C. amplifier 28 is connected to the terminal 10 via capacitor 50 and the parallel network of resistor 52 and capacitor 54. The capacitor 50 and the network provide a path to the input terminal 26 of the amplifier 28 for high frequency components of the signal appearing across input terminals 10 and 12. A low frequency and direct voltage path to the input terminal of amplifier 28 is provided through the resistor 56, capacitor 58 and a conventional alternating voltage (herein "A.C.") amplifier 60. A chopper 62, shown schematically as a switch, is preferably connected between the junction of resistor 56 and capacitor 58 and the output terminal 14 of the amplifier. The chopper 62 is driven by a free-running multivibrator 64. In practice I have found that transistor multivibrators and choppers of conventional types may be used to perform these functions and thus I have not illustrated them in detail. It will be observed that the voltage supplied to A.C. amplifier 60 as an input signal is an alternating one whose amplitude is proportional to the difference between the input and output signals of the overall amplifier of FIG. 2. This is in contrast to conventional D.C. amplifiers which generally provide a separate loop which includes a differencing circuit to provide a signal proportional to the difference between input and output signal, a chopper, and an A.C. amplifier to amplify this difference and apply it as a correction signal for drift cancellation to the D.C. amplifier. In amplifiers made according to my invention, in which the reference potential for the A.C. and D.C. amplifiers is the output potential, the arrangement illustrated inherently provides for drift cancellation. In effect, the chopper is inserted in the internal negative feedback loop of the amplifier 28, providing for drift cancellation directly rather than requiring a separate loop around the amplifier.

The output signal of the A.C. amplifier 60 is demodulated in a conventional demodulator circuit 66, also driven by multivibrator 64; after demodulation, the signal is filtered as by filter 68 and applied to the input terminal 26 of amplifier 28. Amplifier 28 is preferably a conventional transistor amplifier having a gain of approximately 100,000. Its output signal is applied to the base 32 of transistor 34 in the manner described in connection with FIG. 1.

It will be observed that the transistor 34 is one of a "string" of elements connected in series between the positive terminal of battery 20 and the negative terminal of battery 22. As shown this string of elements includes the constant current regulator generally indicated at 38, the Zener diode 70 and capacitor 72 in parallel, transistor 34, resistor 74, the Zener diode 76 and capacitor 78 in parallel, and transistor 80. A fixed bias with respect to the output terminal 14 of the amplifier for transistor 80 is provided by the voltage source generally indicated at 82 and the circuit generally indicated at 84 is adapted to maintain current through the Zener diode 86 which forms a part of the voltage source 82.

The constant current regulator at 38 includes the transistor 88 and Zener diode 90. As shown, the Zener diode is connected in series with resistors 92 and 94 across the total battery voltage. By proper selection of the value of these resistances the diode can be maintained in a "lighted" condition and thus maintain a substantially constant voltage across its terminals. The emitter-base diode of transistor 88 is connected in series with resistor 96 and in parallel with the substantially constant voltage drop provided by the Zener diode 90, which thus maintains a substantially constant bias current through resistor 96 and the transistor 88. Thus despite variation in the collector potential, the current through transistor 88 will remain substantially constant because of the constant base current.

The positive supply voltage with respect to the output terminal 14 for operation of the amplifiers and other circuitry corresponding to the battery 44 of FIG. 1 is provided by the voltage drop across the Zener diode 70. In the illustrated embodiment a 5 volt supply is desired and therefore a diode having a 5 volt potential is used. Zener diodes are sometimes noisy and to prevent circuit malfunction for this reason, I provide the capacitor 72 in parallel with the diode 70. The positive supply for the D.C. and A.C. amplifiers, multivibrator and demodulator is taken from the upper terminal of the diode 70.

The next element in the string, the transistor 34, has been previously discussed. In practice, I have found that it is undesirable to require the transistor 34 to absorb the full voltage variation or swing in output voltage. For this reason I provide the transistor 80 which absorbs the output voltage swing, the voltage across transistor 34 remaining substantially constant. As will be explained in greater detail below, the base of transistor 80 is maintained at a potential which is 10 volts below the potential of the output terminal 14. Thus, despite change in the output potential, the base voltage of transistor 80 and therefore the emitter voltage (except for the small emitter-base diode drop) is always 10 volts below the output potential. Since transistor 34 is connected between the output terminal and the upper terminal of Zener diode 76, which is a 5 volt diode, and since the emitter of transistor 80 is 10 volts below the output potential at all times, the voltage across transistor 34 and its collector resistor 74 cannot be more than 5 volts. It will be observed that the collector of transistor 80 is connected to battery 22 which is a fixed potential. Hence the output voltage variation of the amplifier actually appears across transistor 80 rather than across transistor 34. One advantage of this arrangement is that substantially the same amplifier circuit may be used to provide different voltage swings as desired. Thus, using 24 volt supplies for batteries 20 and 22 and the circuit arrangement of FIG. 2, I have found that output voltage swings of ±12 volts are readily achievable. If battery supplies of approximately 150 volts are used, output voltage swings of greater than ±100 volts are achievable.

Figure 3:
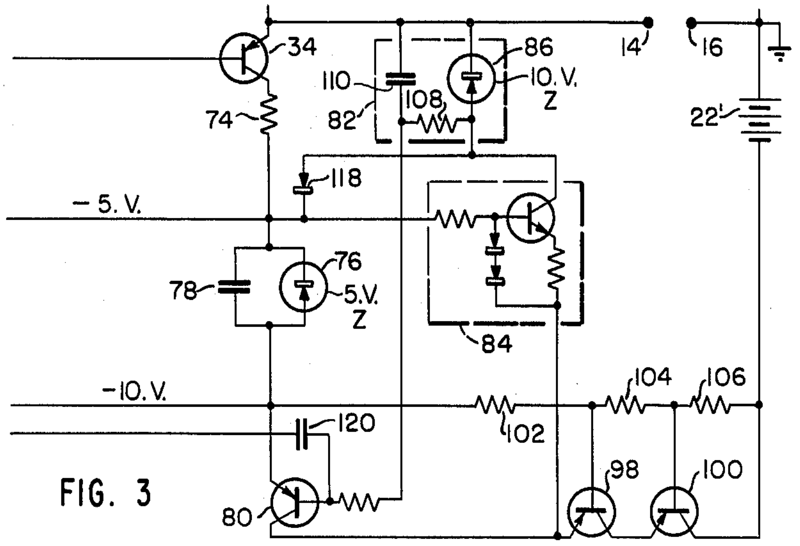
FIG. 3 is a fragmentary schematic diagram of an amplifier made similar to that of FIG. 2, but modified for wider output voltage swings.

For this latter amplifier, the circuit of FIG. 3 is utilized in place of the circuit of FIG. 2. As shown therein, the circuit of FIG. 2 has been modified by the addition of the transistors 98 and 100 to the current string and resistors 102, 104 and 106 connected as shown and a larger battery 22'. The resistors 102, 104 and 106 are preferably substantially equal in size.

The base, and therefore the emitter of transistor 80 is held at a constant potential 10 volts below that of terminal 14 as in the circuit of FIG. 2. With variations in potential on terminal 14, the base and emitter voltage of transistor 80 will vary directly therewith. The base and emitter of transistor 98 will be at ⅔ of this potential and the base and emitter of transistor 100 at ⅓ of this potential. Thus the total required voltage swing is here divided over the three transistors 80, 98 and 100. Additional transistors and resistors may be added to this chain as desired to provide for greater swings, all without alteration of the basic circuit.

Thus by using a transistor, or chain of transistors between one of the supplies and the output terminal, rather than the output transistor of the amplifier to absorb the output voltage swing, I have provided a transistor amplifier whose circuit may be readily modified to provide any desired output voltage swing without requiring expensive or unavailable transistor types.

In the circuit of FIG. 3 I have not illustrated a constant current regulator. In some instances it may be necessary to modify the constant current regulator from that shown in FIG. 2 to permit greater voltage variation across its terminals. However such designs are known to those skilled in the transistor amplifier art, and a specific design is not illustrated for this reason.

I have illustrated the novel output circuit of my invention by showing a constant current regulator connected between the positive battery and transistor 34, and the transistors which absorb the voltage swing connected between the collector of transistor 34 and the negative battery or current sink 22. It will be apparent however that by the use of complementary transistor types, the constant current regulator might be replaced by a constant current sink, and that the string of transistors which absorb the voltage swing would then be connected between the positive battery or current source and the amplifier output terminal.

In FIGURE 2, the network corresponding to the network 24 in FIGURE 1 includes the chopper 62, resistor 56 and condenser 58, alternating voltage amplifier 60 and the associated demodulator 66 and filter as well as resistor 52 and condensers 50 and 54. It will be observed that the chopper alternately connects the output and input terminals together through resistor 56 thereby providing an alternating difference signal at the input terminal of amplifier 60. This signal is amplified, demodulated, filtered and applied as the input signal to amplifier 28. In all other respects the operation of the circuit of FIGURE 2 thereafter is similar to that of FIGURE 1 described above.

As shown in FIG. 2 a 10 volt supply which is negative with respect to the output terminal is taken from the emitter of transistor 80, corresponding to the voltage provided by the battery 46 in FIG. 1 and is connected to the components of the amplifier. A five volt supply which is also negative with respect to output terminal 14 is provided at the terminal 122 by the Zener diode 76 and its noise suppressing capacitor 78 in series between transistor 34 and transistor 80. This supply is actually five volts "positive" with respect to the "negative" ten volt supply, and hence is five volts below the voltage of the output terminal as explained above.

The bias supply for the base of transistor 80 is provided by the 10 volt Zener diode 86; a filter network including resistor 108 and capacitor 110 is provided in parallel with the diode to filter undesirable noise. The bias supply is taken from the junction of resistor 108 and capacitor 110, the output terminal of the noise filter.

The constant current regulator generally indicated at 84 is provided to insure an adequate current supply for the 10 volt Zener diode 86. It includes a transistor 112 whose base is biased at a fixed −5 volt potential with respect to the output. A pair of diodes 114 and 116 connected in series between this −5 volt potential and the negative terminal of battery 22 provide a constant voltage drop between base and emitter and the transistor 112. Because this current "source" is connected to the negative side of the supply voltage an n-p-n type transistor is used. In terms of conventional current flow, the circuit 84 together with the battery 22 is a constant current sink rather than a source and will be referred to herein as a "negative constant current source."

As shown in FIG. 2, a diode 118 is connected between the lower terminal of Zener diode 86 and the −5 volt supply, i.e. the upper terminal of Zener diode 76. With the understanding of the circuit operation given by the foregoing discussion, the function of this diode may now be explained.

Under normal conditions this diode is back biased and does not conduct. However, under the circumstances to be described it prevents "lock-up" and malfunction of the amplifier and also prevents possible damage thereto.

Although not shown in FIG. 2, the load connected across terminals 14 and 16 will have associated with it some capacitance, either actual or distributed. Thus, changes in the emitter potential of transistor 34 will lag slightly changes in its base potential. For changes which are slow compared to this time lag, or very rapid changes in the negative direction this capacity across terminals 14 and 16 will not adversely affect the amplifier operation. However, for sudden positive changes in input signal, which appear on the base of transistor 34, the base potential may rise faster than the emitter potential and cut off the transistor. Under these conditions the collector potential of transistor 34 drops toward the potential of battery 22 and, if diode 118 were not present, transistor 80 would also cut off. This would drop the −10 volt supply and render the amplifier inoperative. Further, this condition might cause transistor damage.

To prevent this condition from occurring, I provide the diode 118 connected as shown. If the potential of the collector circuit of the transistor 34 drops below the potential at the lower end of the Zener diode, diode 118 conducts, providing a path for current from the current source 38 to the transistor 80. This transistor will then remain conducting, the appropriate supply voltages will be maintained and the amplifier will continue to function in a normal fashion despite the fact that transistor 34 is momentarily cut off.

Also, as shown in FIG. 2, I provide a capacitor 120 connected between the base of transistor 80 and input terminal 10. It is a desirable addition to the circuit to improve its stability, and in some instances the circuit will oscillate without it.

The capacitor might be connected from the base of transistor 80 to ground and this would serve the same stabilizing function. However, such a configuration may slow the response speed of the amplifier. To obviate this problem I have found it desirable to connect the capacitor as shown between the base of transistor 80 and the input terminal. With this connection output response speed is not significantly affected, but the desired amplifier stabilizing effect is achieved.

Figure 4:
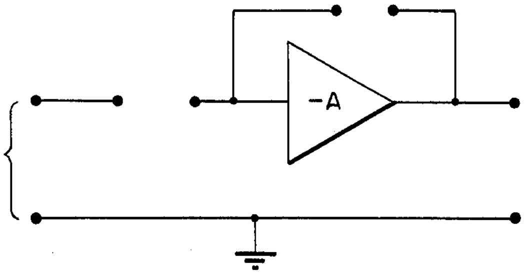
FIG. 4 is a schematic representation of an "operational" amplifier such as is used in analog computers.

My invention has been described as an amplifier useful as a buffer amplifier to provide an impedance match between a relatively high impedance circuit and a comparatively low impedance measuring device. However, D.C. amplifiers having the characteristics described herein are also useful in analog computation. For this purpose it is desirable to have an amplifier in the so-called "operational" amplifier configuration shown in FIG. 4. This configuration includes an input and an output terminal, both of which are with respect to ground and an amplifier having a gain of —A. The computer designer then may insert resistors, capacitors, or other elements in series with the amplifier and in the feedback path around the amplifier to produce an integrator, multiplier, summer, etc.

Figure 5:
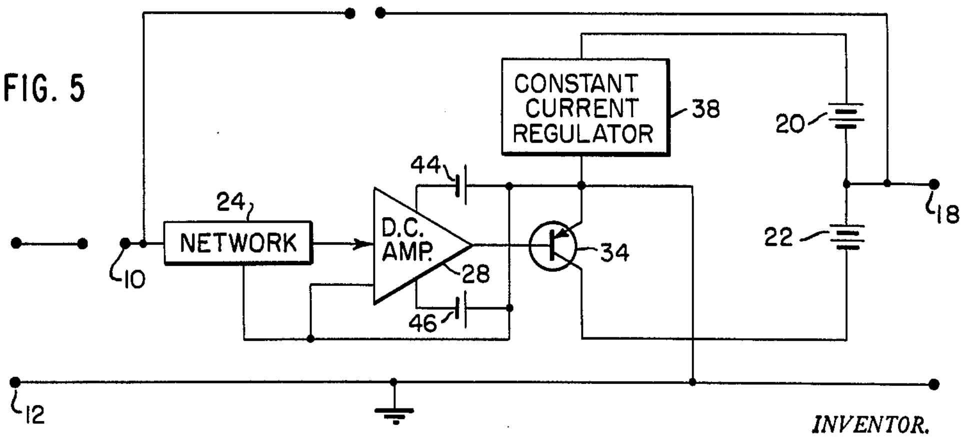
FIG. 5 is a block and line diagram similar to FIG. 1 showing the manner in which an amplifier made according to my invention may be connected as an "operational" amplifier.

The amplifier of my invention may be utilized as an operational amplifier as shown in FIG. 5 by grounding the nominal output terminal 14 and using the common terminal 18 of the power supplies or batteries 20 and 22 as the output terminal. An output voltage of the correct polarity will then appear between terminal 18 and the reference potential, here shown as ground. Appropriate feedback elements may be inserted in the internal amplifier feedback loop, or the overall amplifier gain may be adjusted and an external feedback loop provided.

Thus, I have provided an improved "D.C." amplifier having very high input impedance and capable of providing wide output voltage swings. These characteristics are achieved, in a preferred embodiment, in an amplifier using only transistors or other semi-conductor devices as the only active elements, thus achieving advantages attainable in the past only in complex vaccum tube amplifiers. The circuit of my invention, with but slight modification, may be used to provide whatever output voltage swing is desired.

Further, while I have described my invention as being particularly applicable to D.C. amplifiers using transistors as the active elements, it will be obvious to those skilled in this art that vacuum tubes might be used in either the D.C. amplifier 28, the A.C. amplifier 60 or in the amplifier output stage in place of transistor 34 rather than transistors. Of course, larger voltages would be required than for transistors. However, my invention while particularly applicable to transistors is not limited thereto.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. An electrical signal amplifier having a pair of input and a pair of output terminals comprising, in combination, a direct coupled amplifier, having an input terminal, an output terminal and a common terminal, means connecting said direct coupled amplifier input terminal to a first of said signal amplifier input terminals, a transistor having a base terminal, an emitter terminal and a collector terminal, means connecting the output terminal of said direct coupled amplifier to the base terminal of said transistor, means connecting a first terminal of said transistor other than said base terminal to the common terminal of said direct coupled amplifier, a potential source having a positive terminal, a negative terminal and a common terminal, means connecting the positive and negative terminals of said potential source to supply potentials for the elements of said direct coupled amplifier and means connecting the common terminal of said potential source to the common terminal of said direct coupled amplifier, means providing a first source of direct current having a pair of terminals, means connecting said first terminal of said transistor to a first terminal of said current source, means connecting a second terminal of said transistor other than said base terminal to a second terminal of said current source, the output signal of said signal amplifier appearing between said first terminal of said transistor and the second terminal of said current source, means connecting the first terminal of said transistor to one output terminal of said signal amplifier, and means connecting the second terminal of said current source to the second input terminal and to the other output terminal of said signal amplifier.

2. The combination defined in claim 1 which includes a second transistor having a base terminal, means maintaining said base at a fixed potential with respect to the first terminal of said first transistor, means connecting a first terminal other than the base of said second transistor to the second terminal of said first transistor, and means connecting a second terminal of said second transistor to the second terminal of said current source.

3. The combination defined in claim 1 in which said transistor is of the p-n-p type, the emitter of said transistor being connected to the first terminal of said current source, and which includes a second transistor of the p-n-p type, means maintaining the base of said second transistor at a fixed potential with respect to the emitter of said first transistor, means connecting the emitter of said second transistor to the collector of said first mentioned transistor, and means connecting the collector of said second transistor to the second terminal of said current source.

4. An electrical signal amplifier having a pair of input and a pair of output terminals comprising, in combination, a direct coupled amplifier, having an input terminal, an output terminal and a common terminal, means connecting said direct coupled amplifier input terminal to a first of said signal amplifier input terminals, a transistor having a base terminal, an emitter terminal and a collector terminal, means connecting the output terminal of said direct coupled amplifier to the base terminal of said transistor, means connecting a first terminal of said transistor other than said base terminal to the common terminal of said direct coupled amplifier, a potential source having a positive terminal, a negative terminal and a common terminal, means connecting the positive and negative terminals of said potential source to supply potentials for the elements of said direct coupled amplifier and means connecting the common terminal of said potential source to the common terminal of said direct coupled amplifier, means providing a first source of direct current having a pair of terminals, means providing a second source of direct current of opposite polarity to said first source, said sources having a common terminal, means connecting said first terminal of said transistor to the non-common terminal of said first current source, means connecting a second terminal of said transistor other than said base terminal to the non-common terminal of said second current source, the output signal of said signal amplifier appearing between said first terminal of said transistor and the common terminal of said current sources, means connecting the first terminal of said transistor to one output terminal of said signal amplifier, and means connecting the common terminal of said current sources to the second input terminal and to the other output terminal of said signal amplifier.

5. The combination defined in claim 4 which includes a second transistor having a base terminal, means maintaining said base at a fixed potential with respect to the first terminal of said first transistor, means connecting a first terminal other than the base terminal of said second transistor to the second terminal of said first transistor, and means connecting a second terminal of said second transistor to the non-common terminal of said second current source.

6. The combination defined in claim 4 in which said transistor is of the p-n-p type, the emitter of said transistor being connected to the non-common terminal of said first current source, and which includes a second transistor of the p-n-p type, means maintaining the base of said second transistor at a fixed potential with respect to the emitter of said first transistor, means connecting the emitter of said second transistor to the collector of said first mentioned transistor, and means connecting the collector of said second transistor to the non-common terminal of said second current source.

7. An electrical signal amplifier comprising, in combination, a pair of input terminals, a pair of output terminals, one of said input terminals and one of said output terminals being connected in common, a direct coupled amplifier having an input terminal, an output terminal, a reference terminal and at least one terminal for connection to a power source, means connecting said first direct coupled amplifier input terminal to the input terminal not connected in common with an output terminal, an output stage for said electrical signal amplifier having an input terminal, an output terminal, and a reference terminal, means connecting the output terminal of said direct coupled amplifier to the input terminal of said output stage, means connecting the output terminal of said output stage to the reference terminal of said direct coupled amplifier; means connecting the output terminal of said output stage to the output terminal of said signal amplifier not connected in common with an input terminal, means connecting the reference terminal of said output stage to the signal amplifier output terminal connected in common with an input terminal, a first power source for said direct coupled amplifier, said first power source being connected between the reference terminal of said direct-coupled amplifier and the power source terminal of said direct-coupled amplifier; and a second power source for said output stage connected between the output terminal of said output stage and the output terminal of said signal amplifier connected in common with the input terminal.

References Cited by the Examiner

UNITED STATES PATENTS

| | | | |
|---|---|---|---|
| 2,593,391 | 4/1952 | Bray | 330—91 X |
| 2,714,136 | 7/1955 | Greenwood | 330—10 |
| 2,832,848 | 4/1958 | Neff | 330—10 |
| 2,858,379 | 10/1958 | Stanley | 330—32 |
| 2,881,269 | 4/1959 | Hanel et al. | 330—32 |
| 2,946,009 | 7/1960 | Gelles | 330—9 X |

ROY LAKE, *Primary Examiner.*

ELI J. SAX, NATHAN KAUFMAN, *Examiners.*